United States Patent [19]

York

[11] 4,333,101
[45] Jun. 1, 1982

[54] SEMICONDUCTOR HEAT SINK MOUNTING ASSEMBLY

[75] Inventor: Robert A. York, Dillsburg, Pa.

[73] Assignee: Flight Systems, Inc., Mechanicsburg, Pa.

[21] Appl. No.: 188,202

[22] Filed: Sep. 18, 1980

Related U.S. Application Data

[63] Continuation-in-part of Ser. No. 58,055, Jul. 19, 1979, abandoned.

[51] Int. Cl.³ .............. H01L 23/48; H01L 29/44; H01L 23/42
[52] U.S. Cl. ................................ 357/79; 357/65; 357/68; 357/81
[58] Field of Search ............... 357/79, 81, 68, 65

[56] References Cited

U.S. PATENT DOCUMENTS

| 2,907,935 | 10/1959 | Nagorsen | 357/79 |
|---|---|---|---|
| 3,688,159 | 8/1972 | Robbins | 357/79 |
| 3,715,632 | 2/1973 | Warburton | 357/79 |
| 3,753,053 | 8/1973 | Rosser | 357/81 |
| 3,755,719 | 8/1973 | Wilcox | 357/81 |
| 3,763,402 | 10/1973 | Shore et al. | 357/81 |
| 3,766,977 | 10/1973 | Pravda et al. | 357/81 |
| 3,812,557 | 5/1974 | Meyer | 357/79 |
| 3,972,063 | 7/1976 | Kimura et al. | 357/79 |
| 4,159,483 | 6/1979 | Bettin | 357/79 |

FOREIGN PATENT DOCUMENTS

| 1039648 | 9/1958 | Fed. Rep. of Germany | 357/79 |
|---|---|---|---|
| 2711931 | 9/1978 | Fed. Rep. of Germany | 357/79 |
| 803295 | 10/1958 | United Kingdom | 357/79 |

*Primary Examiner*—Andrew J. James
*Attorney, Agent, or Firm*—Seidel, Gonda, Goldhammer and Panitch

[57] ABSTRACT

A field replaceable silicon controlled rectifier (SCR) heat sink with reliable thermal and electrical connection to the SCR or other electronic device for an electronic circuit forming part of a vehicle control. The SCR heat sink includes two discrete heat sink blocks having opposed parallel faces between which an SCR or other electronic device may be properly clamped. At least one insulator hold down bar and an associated spring overlie a flange on the lowr end of each block and facilitate clamping the blocks to a base plate. The blocks are clamped to the SCR by a force distributing spring and bolts for properly applying a clamping force to the SCR or other electronic device.

8 Claims, 10 Drawing Figures

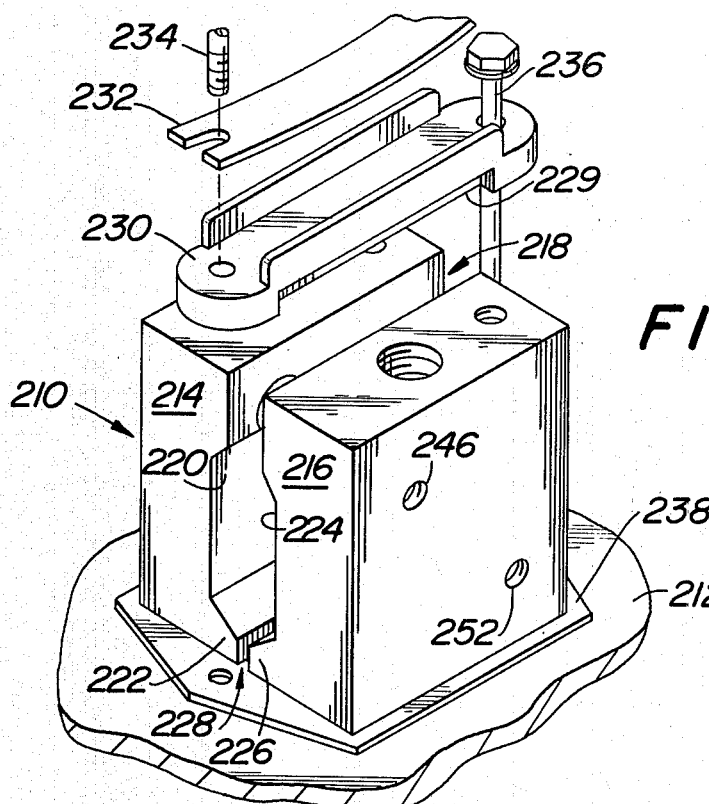
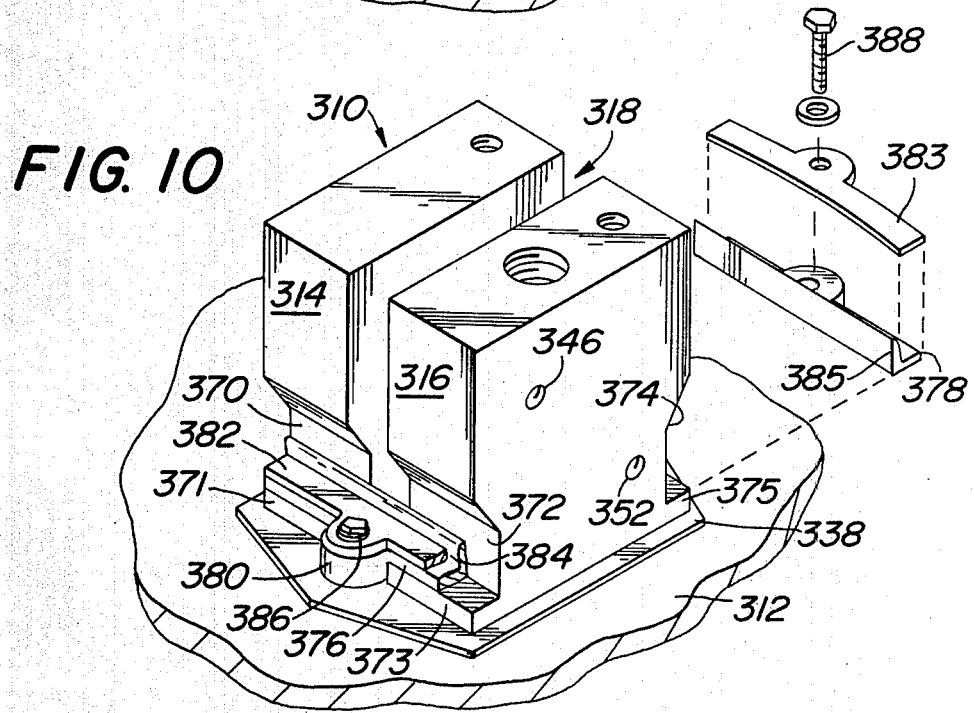

SEMICONDUCTOR HEAT SINK MOUNTING ASSEMBLY

This application is a continuation-in-part of my prior copending application Ser. No. 58055 filed July 19, 1979, now abandoned.

BACKGROUND OF THE INVENTION

Heat sinks for electronic devices such as silicon controlled rectifiers (SCRs) for vehicle control systems are in common use. For example, they are used in SCR vehicle controls sold by the General Electric Company such as GE Catalog No. 259A8783G2 Rectifier Assembly. The assembly includes both the heat sink and the SCR which is sold as a single replacement unit covered with potting material even though it is usually only the SCR which needs to be replaced. The reason given is the difficulty in properly installing the SCR so that is makes correct thermal and electrical contact with the heat sink. The SCR is designed so that it must be clamped with the proper amount of force on both terminals. If not properly installed, the SCR will usually test as operative but fail within a few hours after the vehicle is placed back into use. To avoid such problems, the procedure usually followed is the costly one of installing an entire heat sink and SCR assembly.

Accordingly, there is a need for an SCR heat sink that can be reliably used in the field by workmen needing little in the way of instruction to properly install a new SCR in the heat sink. More particularly, there is a need for an SCR heat sink that can replace existing heat sink assemblies and be continuously and easily used thereafter while only the SCR is being replaced.

SUMMARY OF THE INVENTION

The heat sink of the present invention includes first and second heat sink blocks of good thermally conductive material such as aluminum. The blocks have opposed parallel faces for clamping an electronic device such as an SCR therebetween. Each block has a mating flange on the lower end thereof.

A clamp bar of electrically insulating material is provided for retaining the blocks in spaced apart position on a base plate. The blocks are clamped to the base plate by an insulator hold down bar which locates and aligns the heat sink blocks with respect to each other and seals and protects the heat sink blocks from accidental shorting caused by foreign material particles and the like. The hold down bar, which is longer than each flange, overlies each flange and provides a spacer between said blocks. The hold down bar also has fastener means on each end for clamping the blocks to a base plate. A hold down spring is designed so that the fastener means cannot be overtightened. The spring is normally curved upwardly, overlies said clamp bar and is coupled to each fastener means.

A clamping spring means is provided for clamping said blocks to the SCR or other electrical device. The blocks are designed so that they may be extruded to thereby avoid the expensive cost associated with machining or casting the blocks. The blocks need only a minimum of machining where appropriate as will be made clear hereinafter. Moreover, there are no ears on the blocks for clamping the blocks to a baseplate.

It is an object of the present invention to provide a novel SCR heat sink which facilitates simple, reliable maintenance and minimizes replacement errors.

Other objects will appear hereinafter.

For the purpose of illustrating the invention, there is shown in the drawings forms which are presently preferred; it being understood, however, that this invention is not limited to the precise arrangements and instrumentalities shown.

BRIEF DESCRIPTION OF THE DRAWINGS

FIG. 9 is a perspective view of a third embodiment of the heat sink of the present invention with a hold down bar and spring exploded out from the heat sink.

FIG. 10 is a perspective view of a fourth embodiment of the heat sink of the present invention with a hold down bar and spring exploded out from the heat sink.

DETAILED DESCRIPTION OF THE INVENTION

Figure 1:
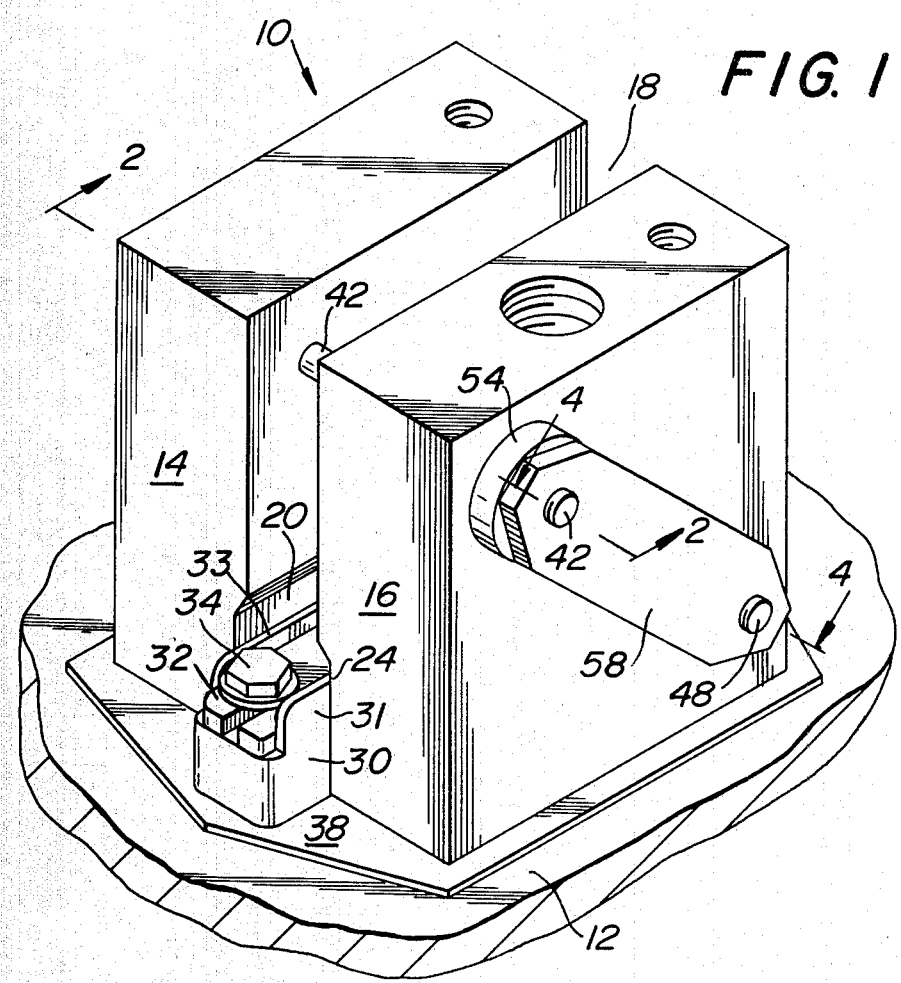
FIG. 1 is a perspective view of a first embodiment of the heat sink of the present invention.

Referring to the drawings in detail, wherein like numerals indicate like elements, there is shown a heat sink 10 of the present invention for supporting an electronic device such as an SCR 40. The heat sink 10 is shown in FIG. 1 insulatively mounted on a base plate 12 of aluminum or comparable material.

The heat sink 10 includes a left heat sink block 14 and a right heat sink block 16. Each of the blocks 14, 16 are made from a good thermally and electrically conductive material such as aluminum.

Figure 2:
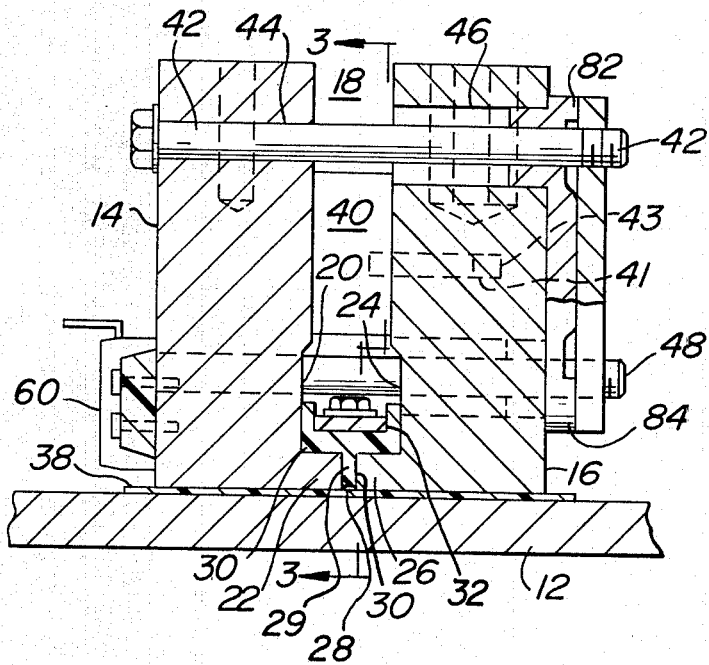
FIG. 2 is a sectional view taken along the line 2—2 in FIG. 1.

Referring to FIG. 2, the blocks 14 and 16 are spaced from one another so as to define gap 18. Block 14 is provided with an undercut 20 adjacent the lower end portion thereof. From the lower end of the undercut 20, there extends a horizontally disposed flange 22. Block 16 is provided with a similar undercut 24 and horizontally disposed flange 26. The flanges 22, 26 extend toward one another but are spaced from one another across the gap 28.

Figure 3:
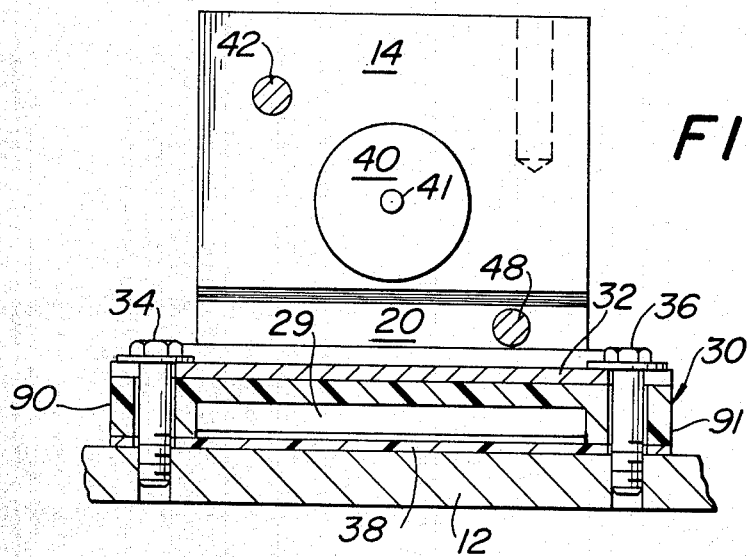
FIG. 3 is a sectional view taken along the line 3—3 in FIG. 2.

A hold down bar 30 of electrically insulating material such as Noryl, Cycolac or Cycoloy or similar plastic is provided. The plastic should also be of the type that does not flow when a force is applied to it. The hold down bar 30 is wider than the combined width of each of the flanges 22, 26. Also, the hold down bar 30 is longer than each of the flanges 22, 26 as is apparent in FIG. 3. The bottom surface of the hold down bar 30 is undercut so that it may overlie the top surface of the flanges 22, 26. Each end portion 90 and 91 of hold down bar 30 projects beyond the ends of the flanges 22, 26 and is provided with a drilled hole. Bolts 34, 36 extend through each of two drilled holes in the hold down bar 30 and are threadedly connected to a tapped hole in the base plate 12. A web 29 on the underside of hold down bar 30 projects into the gap 28.

A hold down spring 32 of a material such as spring steel overlies the upper surface of the hold down bar 30 between the upstanding rims 31, 33 on the hold down bar 30 which prevent contact between spring 32 and blocks 14, 16. The spring 32 is curved upwardly in its relaxed state. The ends of the spring 32 are provided with notches 35, 37 for accommodating the shank of the bolts 34, 36. When the bolts 34, 36 have been tightened so as to flatten down the upwardly curved spring 32, the blocks have been properly anchored to the base plate 12. By this arrangement, the mechanic can feel when the spring 32 is flat by a significant increase in torque. Thus, he knows that the bolts have been properly tightened. Spring 32 evenly distributes the hold down force along the length of the hold down bar 30.

An electrical insulation sheet 38 overlies the base plate 12 and is provided with holes properly spaced to accommodate the bolts 34, 36. Sheet 38 electrically insulates the blocks 14 and 16 which are electrically connected to the SCR 40. Hold down bar 30 is spaced slightly above insulator sheet 38 (approximately 0.005 inch) so it can move slightly when the bolts 34, 36 are torqued down.

An electronic device 40, such as an SCR, is clamped between the juxtaposed parallel faces of the blocks 14 and 16 within the gap 18. Device 40 is orientated to a predetermined location in the gap 18 by the projecting pin 41 which is fixed in the locator blind hole 43 in one of the blocks such as block 16. Device 40 has parallel flat side faces for good surface contact with the opposing faces of the blocks 14, 16.

Figure 4:
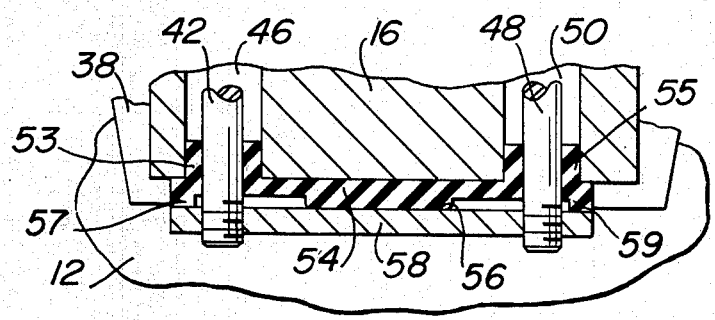
FIG. 4 is a sectional view taken along the line 4—4 in FIG. 1.

The force on the device 40 by the blocks 14, 16 is applied by way of clamping bolts 42 and 48. Referring to FIGS. 2 and 4, the block 14 has a bore 44 axially aligned with a bore 46 in the block 16. The diameter of bore 46 is greater than the diameter of bore 44. A bolt 42 extends through the aligned bores 44, 46 and across the gap 18. As shown more clearly in FIGS. 1 and 3, the bolt 42 is adjacent an upper corner on the blocks 14, 16. Bolt 48 is adjacent a diagonally opposite corner of blocks 14, 16 and extends through aligned bores. The bore 50 in block 16 accommodates the bolt 48 and is larger in diameter than the aligned bore in the block 14.

An electrical insulator member 54 extends between the bores 46, 50. Member 54 has hollow bosses 53 and 55 adjacent each end. One boss 53 extends into bore 46 and the other boss 55 extends into bore 50. Member 54 has a thickened middle section 56 and thickened end sections 57 and 59. End portions 57 and 59 act as stops to prevent overtightening when the spring is drawn down.

A spring 58 overlies the exposed surface of member 54. In its unstressed state, the end portions of spring 58 are curved outwardly from the bores 46, 50. Spring 58 has threaded holes adjacent each end portion thereof for receiving the threaded end of the bolts 42, 48. The bolts 42, 48 are tightened so as to flatten out the end portions of spring 58. Overtightening of the bolts 42 and 48 is thereby precluded.

Device 40 is preferably an SCR of the type that requires pressure by the heat sink blocks 14 and 16 to made a good electrical and heat transfer connection. The manufacturer specifies the force which typically is an 800 pound force applied to the type of SCR used in lift trucks.

Spring 58 is a relatively stiff spring; e.g., a spring requiring 2000 pounds force to flatten it. This much spring force is required because of a 2:1 reduction ratio in the force actually applied to the device 40. Spring 58 cooperates with member 54 which holds the spring in position so that its force is applied to the centrally positioned electrical device 40. Moreover, the member 54 and spring 58 assure that the spring force vector is normal to the surface of the device within allowable tolerances such as ±6°.

A gate terminal 60 may be removably bolted to one of the blocks such as block 14 at any convenient location. Gate terminal 60 is conventional and adapted to be coupled to the device 40.

The insulator hold down bar 30 locates and aligns the blocks 14, 16 with respect to the base plate 12, facilitates securement of said blocks to the base plate 12, and acts as a spacer between the blocks 14, 16 to oppose excessive tightening of the clamping bolts 42, 48. Also, the hold down bar 30 upper surface defines the flattened out condition for the spring 32 whereby the bolts 34, 36 cannot be overtightened. Web 29 helps prevent the accumulation in gap 28 of foreign material which may cause an electrical short circuit.

The blocks 14, 16 are preferably extruded in the shape as shown. Thereafter, the juxtaposed parallel faces which contact the device 40 are polished so as to have a finished surface such as a finish of 63 microinch RMS. The finished surfaces are perpendicular to the bottom surface of the blocks 14, 16. Suitable holes may be drilled in the blocks where desired to facilitate coupling mounting brackets or other conventional structure. An advantage of using the flanges 22, 26 is that they provide greater contact area than the part which they replace and hence better heat transfer.

Device 40 is readily accessible for replacement by removing the bolts 42, 48, loosening of bolts 34, 36, and then sliding one of the blocks away from the other block so as to increase the size of the gap 18 sufficiently to permit removal of the device 40. Not only are the bolts 42, 48 positioned to assure uniform pressure being applied to the device 40, they are located in a manner which does not interfere with access to the device 40. See FIG. 3 wherein the access of the device 40 lies along an imaginary line interconnecting the axes of the bolts 42, 48.

Figure 5:
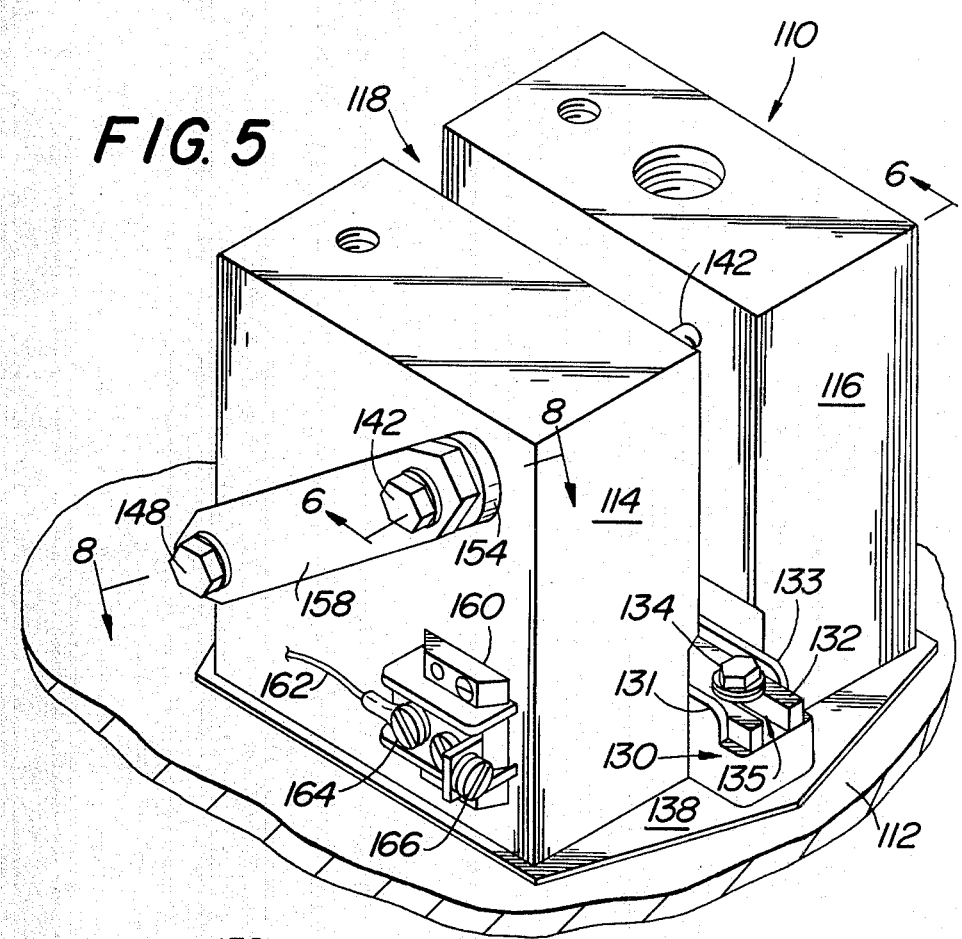
FIG. 5 is a perspective view of a second embodiment of the heat sink of the present invention.

There is shown in FIG. 5 a second embodiment of the present invention, a heat sink 110 for supporting an electronic device such as an SCR 140. The heat sink 110 is insulatively mounted on a base plate 112 of aluminum or comparable material and includes a left heat sink block 114 and a right heat sink block 116. Each of the blocks 114, 116 are uniform in cross-section and have similar properties to blocks 14, 16 described above.

Figure 6:
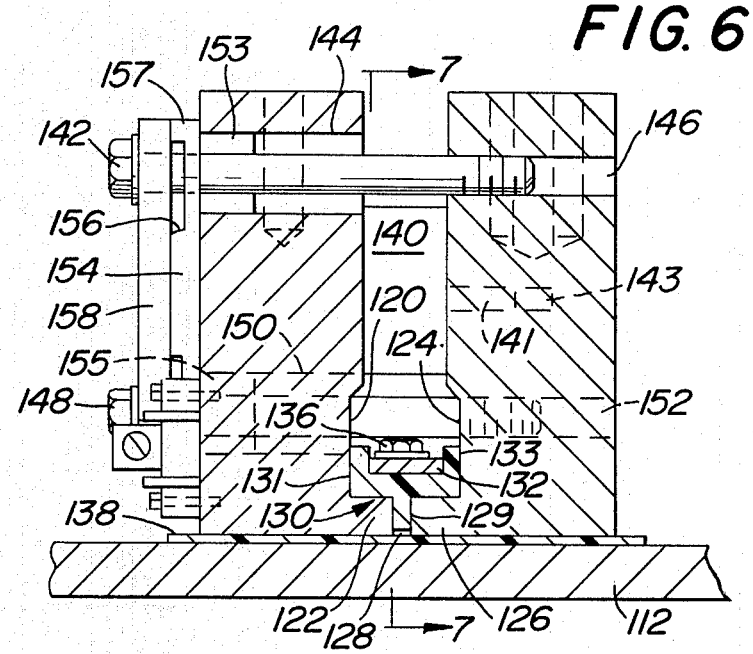
FIG. 6 is a sectional view taken along the line 6—6 in FIG. 5.

Referring to FIG. 6, the blocks 114 and 116 are spaced from one another so as to define a gap 118. Block 114 is provided with an undercut 120 adjacent the lower end portion thereof. From the lower end of the undercut 120, there extends a horizontally disposed flange 122. Block 116 is provided with a similar undercut 124 and horizontally disposed flange 126. The flanges 122, 126 extend toward one another but are spaced from one another across the gap 128.

Figure 7:
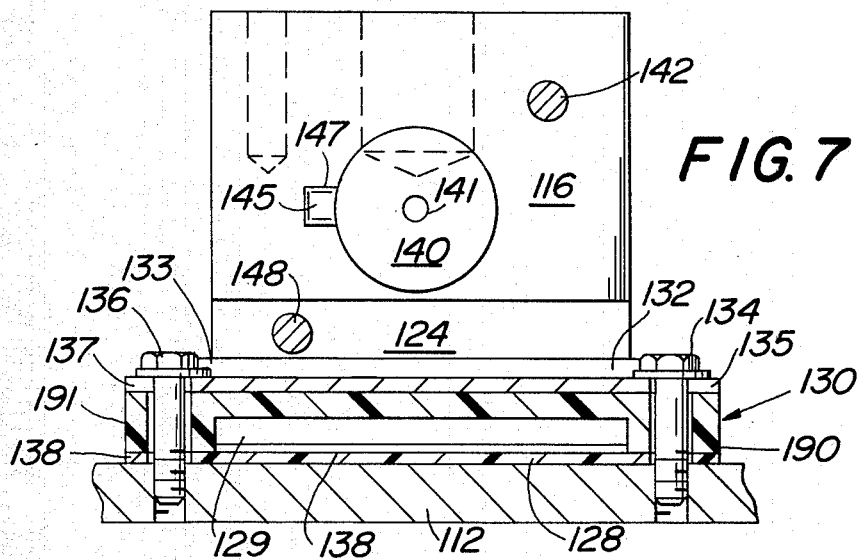
FIG. 7 is a sectional view taken along the line 7—7 in FIG. 6.

A hold down bar 130 of electrically insulating material, such as previously described for bar 30, is wider than the combined width of each of the flanges 122, 126 and longer than each of the flanges 122, 126 as apparent in FIG. 7. The bottom surface of the hold down bar 130 is undercut so that it may overlie the top surface of the flanges 122, 126. Each end portion 190 and 191 of hold down bar 130 projects beyond the ends of the flanges 122, 126 and is provided with a drilled hole. Bolts 134, 136 extend through each of two drilled holes in the hold down bar 130 and are threadedly connected to a tapped hole in the base 112. A web 129 projects into the gap 128.

A hold down spring 132 of a material, such as described for spring 32, overlies the upper surface of the hold down bar 130 between the upstanding rims 131, 133 which prevent contact between spring 132 and blocks 114, 116. The spring 132 is curved upwardly at its end in its relaxed state. The ends of the spring 132 are provided with notches 135, 137 for accommodating the shank of the bolts 134, 136. The bolts 134, 136, when tightened, flatten down the upwardly curved spring 132 anchoring the blocks 114, 116 to the base plate 112. Spring 132 evenly distributes the hold down force along the length of the hold down bar 130.

An electrical insulation sheet 138 overlies the base plate 112 to electrically insulate the blocks 114 and 116. Hold down bar 130 is spaced approximately 0.005 inches above insulator sheet 138 so it can move slightly when the bolts 134, 136 are torqued down.

An electronic device 140, such as the SCR previously described, is clamped between the juxtaposed parallel faces of the blocks 114 and 116 within the gap 118. Device 140 is orientated to a predetermined location in the gap 118 by the projecting pin 141 which is fixed in the locator blind hole 143 in one of the blocks such as block 116. In order to align device 140 properly, contact 145 is placed over marking 147 on the inside surface of one of the blocks such as block 116. This allows an electrical signal cable 162 to be of the correct length to connect device 140 and a gate terminal 160. Device 140 is similar in dimension and shape to device 40.

Figure 8:
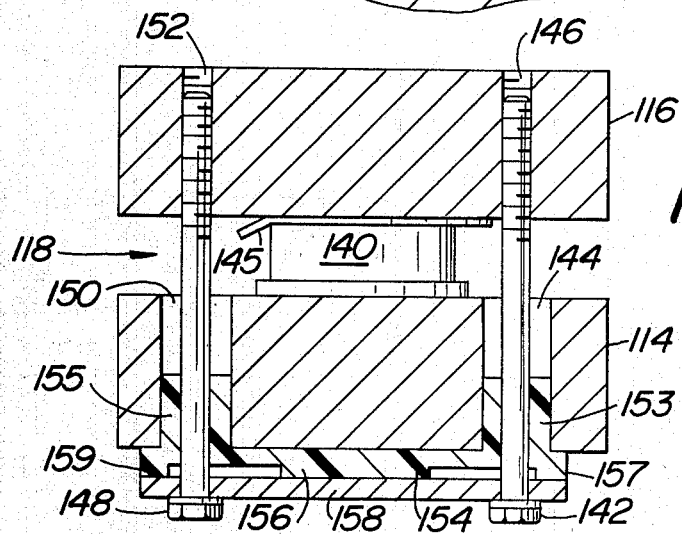
FIG. 8 is a sectional view taken along the line 8—8 in FIG. 5.

The force on the device 140 to be exerted by blocks 114, 116 is applied by way of clamping bolts 142 and 148. Referring to FIGS. 6 and 8, the block 114 has a bore 144 axially aligned with a threaded hole 146 in the block 116. The bolt 142 extends through the bore 144, across the gap 118 and threads into the hole 146 in block 116. As shown more clearly in FIGS. 5 and 7, the bolt 142 is adjacent an upper corner on the blocks 114, 116. Bolt 148 is adjacent a diagonally opposite corner of blocks 114, 116 and similarly extends through bore 150, across gap 118 and threads into the hole 152 in block 116 which is axially aligned with bore 150 in block 114.

An electrical insulator member 154 extends between the bores 144, 150. Member 154 has hollow bosses 153 and 155 adjacent each end. One boss 153 extends into bore 144 and the other boss 155 extends into bore 150. Member 154 has a thickened middle section 156 and thickened end sections 157 and 159. End portions 157 and 159 act as stops to prevent overtightening when the spring is drawn down.

A spring 158 overlies the exposed surface of member 154. In its unstressed state, the end portions of spring 158 are curved outwardly from the bores 144, 150. Spring 158 has bores adjacent each end portion thereof to accommodate the shanks of the bolts 142, 148. The bolts 142, 148 are tightened so as to flatten out the end portions of spring 158 thus preventing overtightening of the bolts 142 and 148.

Device 140 is preferably an SCR of the type that requires pressure by the heat sink blocks 114 and 116 to make a good electrical and heat transfer connection. Since device 140 is similar to device 40 the manufacturer's specifications described previously will also apply to device 140.

Spring 158 is a relatively stiff spring; e.g., a spring requiring 900 pounds of force to flatten it. This spring force is the force actually applied to the device 140 as would be applied to device 40. Spring 158 cooperates with member 154 which holds the spring in position so that its force is applied to the centrally positioned electrical device 140 and assures that the spring force vector is normal to the surface of the device 140 within allowable tolerances such as ±6°.

A gate terminal 160 may be removably bolted to one of the blocks such as block 114 at any convenient location. Gate terminal 160 is conventional and adapted to be coupled to the device 140 by means of electrical signal cable 162. It is preferred that gate terminal 160 be located below bolt 142 on block 114. Gate terminal 160 should be mounted so that the signal cable 162 attaches to the rearward screw contact 164 as shown in FIG. 5. The gate terminal 160 mounted as described provides for the easy connection and disconnection of the signal cable 162 from screw contact 164 and an external signal cable (not shown) from the other screw contact 166.

The heat sink 110 comprised of substantially similar components derives the same benefits and advantages from its components as does heat sink 10 as described on pages 7–8.

A third embodiment of a heat sink 210 of the present invention is shown in FIG. 9. The heat sink 210 is comprised of similar uniform blocks 214, 216 and is also insulatively mounted on a base plate 212. The blocks 214, 216 are spaced apart defining a gap 218 in which the electronic device 240 is mounted in the same manner as described above. Like undercuts 220, 224, the respective blocks 214, 216, extend farther upward in each block than in the two previously described embodiments. At the lower end of the undercuts 220, 224, there are two tapered, rather than squared-off horizontally disposed flanges 222, 226. The flanges 222, 226 extend toward one another across the gap 228. A hold down bar 230 of electrically insulating material, having a web 229 wider than the width of gap 218, keeps the two blocks 214, 216 in constant spaced apart relation while providing a downward clamping force on each block. The hold down bar 230 is longer than each of the blocks described above and has an upwardly curved spring 232 and bolts 234, 236 similar to those described previously to secure the blocks 214, 216 to the base plate 212 in the same manner. The top portion of each block 214, 216 fits into an undercut in the hold down bar 230 so that the bar can overlie the top portion of each block 214, 216 to provide the necessary spacing and support. An electronic device such as the SCR previously described is clamped between the opposing inner-faces of blocks 214, 216 in the same manner as described on pages 6–7.

Referring to FIG. 10, a fourth embodiment of the heat sink 310 is shown. The heat sink 310 is comprised of similar uniform blocks 314, 316 having undercuts 370, 372, 374 adjacent the lower portions thereof. The undercuts 370, 372, 374 extend horizontally across the ends of the blocks 314, 316 rather than the facing sides as described above. Two hold down bars 376, 378 of electrically insulative material similar to the plastic material of bar 30 retain the blocks 314, 316 in spaced apart relation. The bars 376, 378 also provide a downward clamping force on the flanges 371, 373, 375 extending outward from the lower end of each undercut 370, 372, 374. A center portion 380 of each hold down bar 376, 378 extends below the level of the top of the flanges 371, 373, 375 and is so dimensioned as to fit against the insulation sheet 338. The center portion 380 extending across and partially into the gap 318 separates the blocks 314, 316 keeping them in constant spaced relation. Springs 382, 383 of material such as spring steel overlie the upper surface of the hold down bars 376, 378. Rims 384, 385 of the hold down bars 376, 378 separate the springs 382, 383 from the blocks 314, 316 to prevent electrical short circuits. Springs 382, 383 are curved upward at their midpoints in their relaxed states so as to provide tension when tightened down. Bolts 386 and 388 extend through drilled holes in the springs 382, 383 and the hold down bars 376, 378 and are thread-device such as the SCR previously described is clamped between the opposing inner faces of blocks 314, 316 in the same manner as previously described so that access to the device is similarly available.

The present invention may be embodied in other specific forms without departing from the spirit or essential attributes thereof and, accordingly, reference should be made to the appended claims, rather than to the foregoing specification, as indicating the scope of the invention.

I claim:

1. A heat sink for an electric device in a vehicle control system comprising first and second heat sink blocks of thermally conductive material, said blocks having opposed parallel faces for clamping an electronic device therebetween, said blocks having horizontally disposed flanges on the lower ends thereof, a first clamping means of electrical insulating material, said first clamping means being longer than each flange, overlying each flange and constituting a spacer between said blocks, said first clamping means having fastener means for securing said blocks to a base plate, a hold down spring overlying said first clamping means and coupled to each fastener means, a second clamping means extending between said blocks for forcing said faces in a direction toward one another, said second clamping means being electrically insulated from one of said blocks.

2. A heat sink in accordance with claim 1 wherein said hold down spring is curved away from said first clamping means and is flattened out against the upper surface of the first clamping means when said fastener means secures said blocks to a base plate.

3. A heat sink in accordance with claim 1 wherein said second clamping means includes a pair of spaced parallel clamping bolts, a clamping spring extending between said bolts and curved away from an adjacent one of said blocks, said bolts flattening out the curved portion of said clamping spring, said clamping spring being insulated from contact with said one block.

4. A heat sink in accordance with claim 1 wherein said parallel faces of said blocks are undercut adjacent said flanges for receiving said first clamping means therein, said first clamping means being wider than the gap between said parallel faces and wider than the combined width of said flanges whereby said flanges are spaced from one another.

5. A heat sink in accordance with claim 1 wherein said end faces of said blocks are undercut adjacent said flanges for receiving said first clamping means therein, said first clamping means having a portion extending between said opposed parallel faces of said blocks for retaining the opposed parallel faces of said blocks in spaced relation to each other.

6. A heat sink in accordance with claim 1 wherein said first clamping means is at least one hold down bar of electrical insulating material having at least one vertical side wall extending upward from its upper surface to accept the hold down spring against said at least one side wall wherein by said at least one side wall insulates the hold down spring from the blocks.

7. A heat sink in accordance with claim 1 wherein said second clamping means includes parallel bolts extending through aligned holes in said blocks, the holes in one of said blocks being larger in diameter than the mating holes in the other block, an electrical insulating member overlying a side face of said one block and having hollow bosses extending into the larger diameter holes, each clamping bolt extending through one of said bosses whereby said clamping bolts are electrically insulated by said bosses from said one block.

8. A heat sink comprising first and second heat sink blocks of thermally conductive material and uniform cross-section, said blocks having juxtaposed parallel faces for clamping an electronic device therebetween, said blocks having mating horizontally disposed flanges on the lower end thereof, said flanges extending toward one another, a clamp bar of electrical insulating material, said bar being wider than each flange, longer than each flange, overlying each flange and constituting a spacer between said blocks, a discrete fastener means on each end of said bar for securing the bottom surface of said blocks to a base plate, a hold down spring overlying said clamp bar and coupled to each fastener means, said hold down spring having upturned end portions which are flattened out against the upper surface of the hold down bar when said fastener means secures said blocks to a base plate, means preventing contact between said spring and said blocks, clamp means extending between said blocks for adjustably moving said faces in a direction toward one another, said clamping means being electrically insulated from one of said blocks.

* * * * *